United States Patent
Chi et al.

(10) Patent No.: US 9,964,605 B2
(45) Date of Patent: May 8, 2018

(54) METHODS FOR CROSSED-FINS FINFET DEVICE FOR SENSING AND MEASURING MAGNETIC FIELDS

(71) Applicant: GLOBALFOUNDRIES Inc., Grand Cayman (KY)

(72) Inventors: Min-hwa Chi, San Jose, CA (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/190,323

(22) Filed: Jun. 23, 2016

(65) Prior Publication Data
US 2017/0371002 A1    Dec. 28, 2017

(51) Int. Cl.
| | |
|---|---|
| H01L 29/66 | (2006.01) |
| G01R 33/06 | (2006.01) |
| H01L 29/06 | (2006.01) |
| H01L 29/78 | (2006.01) |
| H01L 29/82 | (2006.01) |

(52) U.S. Cl.
CPC ........ G01R 33/066 (2013.01); H01L 29/0649 (2013.01); H01L 29/66545 (2013.01); H01L 29/66795 (2013.01); H01L 29/785 (2013.01); H01L 29/82 (2013.01)

(58) Field of Classification Search
CPC ................ G01R 33/066; H01L 29/66545
USPC ............................................. 324/247
See application file for complete search history.

(56) References Cited

U.S. PATENT DOCUMENTS

| | | | | |
|---|---|---|---|---|
| 6,850,058 | B2 * | 2/2005 | Doyle ................. | G01R 33/06 324/252 |
| 7,358,121 | B2 * | 4/2008 | Chau .................. | B82Y 10/00 257/E29.137 |
| 8,178,429 | B1 * | 5/2012 | Lu ..................... | H01L 21/02532 257/E21.536 |
| 8,927,373 | B2 * | 1/2015 | Rodder ............. | H01L 29/41791 438/294 |
| 2006/0231901 | A1 * | 10/2006 | Chu ................ | H01L 21/823807 257/369 |

(Continued)

OTHER PUBLICATIONS

Marek et al., "Analysis of Novel MagFET Structures for Built-in Current Sensors Supported by 3D Modeling and Simulation", The Seventh International Conference on Advanced Semiconductor Devices and Microsystems, Oct. 12-16, 2008, 4 Pages.

(Continued)

*Primary Examiner* — Jamie C Niesz
(74) *Attorney, Agent, or Firm* — Dithavong & Steiner, P.C.

(57) ABSTRACT

Methods for forming an efficient and effective crossed-fins FinFET device for sensing and measuring magnetic fields and resulting devices are disclosed. Embodiments include forming first-fins, parallel to and spaced from each other, in a first direction on a substrate; forming second-fins, parallel to and spaced from each other on the substrate, in a same plane as the first fins and in a second direction perpendicular to and crossing the first-fins; forming a dummy gate with a spacer on each side over channel areas of the first and second fins; forming source/drain (S/D) regions at opposite ends of each first and second fin; forming an ILD over the fins and the dummy gate and planarizing to reveal the dummy gate; removing the dummy gate, forming a cavity; and forming a high-k/metal gate in the cavity.

10 Claims, 6 Drawing Sheets

(56) References Cited

U.S. PATENT DOCUMENTS

| | | | |
|---|---|---|---|
| 2008/0042202 A1* | 2/2008 | Ieong | H01L 21/845 257/347 |
| 2009/0001426 A1* | 1/2009 | Cheng | H01L 21/845 257/213 |
| 2014/0239395 A1* | 8/2014 | Basker | H01L 29/66795 257/347 |
| 2016/0276350 A1* | 9/2016 | Zang | H01L 27/1104 |

OTHER PUBLICATIONS

Lenz, "A Review of Magnetic Sensors", Proceedings of the IEEE, Jun. 1990, vol. 78, No. 6, 17 Pages.

Perin et al., "Sensing Magnetic Fields in Any Direction Using FinFETs and L-Gate FinFETs", IEEE International SOI Conference, Oct. 1-4, 2012, 2 Pages.

\* cited by examiner

Background

Background

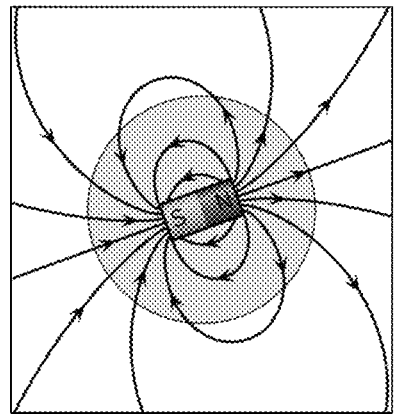
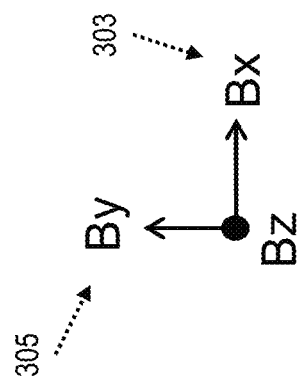
FIG. 3A
FIG. 3B
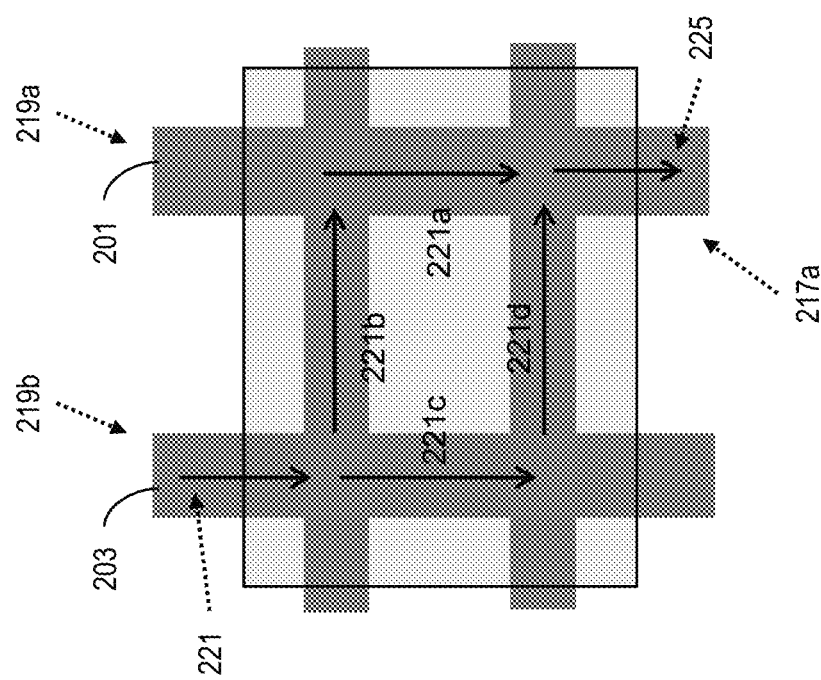
FIG. 2B

METHODS FOR CROSSED-FINS FINFET DEVICE FOR SENSING AND MEASURING MAGNETIC FIELDS

TECHNICAL FIELD

The present disclosure relates generally to designing and fabricating integrated circuit (IC) devices. The present disclosure is particularly applicable to magnetic field sensors in fin-type field-effect transistor (FinFET) IC devices in the 14 nanometer (nm) technology node and beyond.

BACKGROUND

IC devices may include circuitry for on-chip detection and measurement of magnetic fields. Advanced IC devices based on FinFET technology may include FinFET based circuitry for detecting and measuring components of a magnetic field in all directions. FIGS. 1A and 1B illustrate examples of FinFET based magnetic sensors, wherein FIG. 1A is of a U-shaped differential magnetic sensor while FIG. 1B is of a sensor utilizing an L-shaped gate. However, fabrication of the devices in FIGS. 1A and 1B requires complex fabrication processes as well as formation of the devices on a silicon-on-isolator (SOI) layer. These limitations can negatively impact fabrication throughputs and device cost.

Therefore, a need exists for methodology enabling formation of an efficient and effective FinFET based magnetic field sensor and the resulting device.

SUMMARY

An aspect of the present disclosure is a method for an efficient and effective crossed-fins FinFET device for sensing and measuring magnetic fields.

Another aspect of the present disclosure is an efficient and effective crossed-fins FinFET device for sensing and measuring magnetic fields.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming first-fins, parallel to and spaced from each other, in a first direction on a substrate; forming second-fins, parallel to and spaced from each other on the substrate, in a same plane as the first-fins and in a second direction perpendicular to and crossing the first-fins; forming a dummy gate with a spacer on each side over channel areas of the first and second fins; forming source/drain (S/D) regions at opposite ends of each first and second fin; forming an interlayer dielectric (ILD) over the fins and the dummy gate and planarizing to reveal the dummy gate; removing the dummy gate, forming a cavity; and forming a high-k/metal gate in the cavity; and forming contacts through the ILD over the S/D regions.

One aspect includes forming the first and second fins by forming first-fin-spacers, parallel to and spaced from each other, on the substrate; forming second-fin-spacers, parallel to and spaced from each other on the substrate, perpendicular to and crossing the first-fin-spacers; removing exposed sections of the substrate; and removing the first and second fin-spacers to reveal the first and second fins.

One aspect includes forming the first and second fins by forming a hard-mask layer on the substrate; removing sections of the hard-mask layer, forming first-fin patterns and second-fin patterns perpendicular to and crossing the first-fin patterns on the hard-mask; and removing exposed sections of the substrate to form the first and second fins.

Another aspect includes biasing the high-k/metal gate to an inversion state, wherein the S/D regions of the first and second fins are in an electrical floating state.

A further aspect includes connecting a first input current to a drain region of a first first-fin; measuring a first output current at a source region of a second first-fin; and measuring a first current-difference between the first input and output currents in a presence of a magnetic field.

An additional aspect includes disconnecting the first input current; connecting the first input current to a drain region of the second first-fin; measuring a second output current at a source region of the first first-fin; and measuring a second current-difference between the first input and second output currents in the presence of the magnetic field.

In one aspect, a sum of the first and second current differences is proportional to a first component (Bx), in a first direction in a same plane as the first and second fins, of the magnetic field.

In another aspect, a difference between the first and second current differences is proportional to a second component (By), in a second direction in the same plane as the first and second fins, of the magnetic field.

Another aspect includes disconnecting the first input current from the drain region of the second first-fin; connecting a second input current to the drain region of the first first-fin; measuring a third output current at a source region of the first first-fin; and measuring a third current-difference between the second input and third output currents in the presence of the magnetic field.

A further aspect includes disconnecting the second input current; connecting the second input current to a drain region of the second first-fin; measuring a fourth output current at the source region of the second first-fin; and measuring a fourth current-difference between the second input and fourth output currents in the presence of the magnetic field.

In one aspect, a difference between the third and fourth current differences is proportional to a third component of the magnetic field that is perpendicular to a horizontal plane of the first and second fins.

Another aspect of the present disclosure includes a device including: first-fins, parallel to and spaced from each other, in a first direction on a substrate; second-fins, parallel to and spaced from each other on the substrate, in a same plane as the first-fins and in a second direction perpendicular to and crossing the first-fins; source/drain (S/D) regions at opposite ends of each first and second fin; a high-k/metal gate over intersections between two adjacent first-fins and two adjacent second-fins and the first and second fins connecting the intersections; an ILD over the fins and around the high-k/metal gate; and contacts through the ILD over the S/D regions.

Another aspect includes a current measuring means for measuring a first output current at a source region of a second first-fin when a first input current is connected to a drain region of a first first-fin; and a calculating means for measuring a first current-difference between the first input and output currents in a presence of a magnetic field.

In one aspect, the current measuring means further measures a second output current at a source region of the first first-fin when a first input current is connected to a drain region of the second first-fin, and wherein the calculating means further measures a second current-difference between the first input and second output currents in the presence of the magnetic field.

In a further aspect, the calculating means further determines a first component, in a first direction in a same plane as the first and second fins, of the magnetic field proportional to a sum of the first and second current differences.

In an additional aspect, the calculating means further determines a second component, in a second direction in the same plane as the first and second fins, of the magnetic field proportional to a difference of the first and second current differences.

One aspect includes, a current measuring means for measuring a third output current at a source region of the first first-fin when a second input current is connected to the drain region of the first first-fin; and a calculating means for measuring a third current-difference between the second input and third output currents in the presence of the magnetic field.

In another aspect, the current measuring means further measures a fourth output current at the source region of the second first-fin when a second input current is connected to a drain region of the second first-fin, and wherein the calculating means further measures a fourth current-difference between the second input and fourth output currents in the presence of the magnetic field.

In one aspect, the calculating means further determines a third component of the magnetic field, perpendicular to a plane of the first and second fins, proportional to a difference between the third and fourth current differences.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2D illustrate top views of layouts of FinFET based magnetic sensors, in accordance with an exemplary embodiment;

FIG. 3A illustrates the magnetic field being measured; and

FIGS. 3B and 3C illustrate the components of the magnetic field of FIG. 3A.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses the problems of complex fabrication processes and the use of an SOI substrate attendant upon forming FinFET based magnetic field sensors. The present disclosure addresses and solves such problems, for instance, by, inter alia, forming a crossed-fins (e.g. # shaped) FinFET magnetic field sensor structure by using conventional FinFET fabrication processes/steps. Additionally, the crossed-fins sensor has a higher (e.g. two times) sensitivity when compared to the conventional FinFET or planar magnetic field sensors.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figures 1A, 1B:
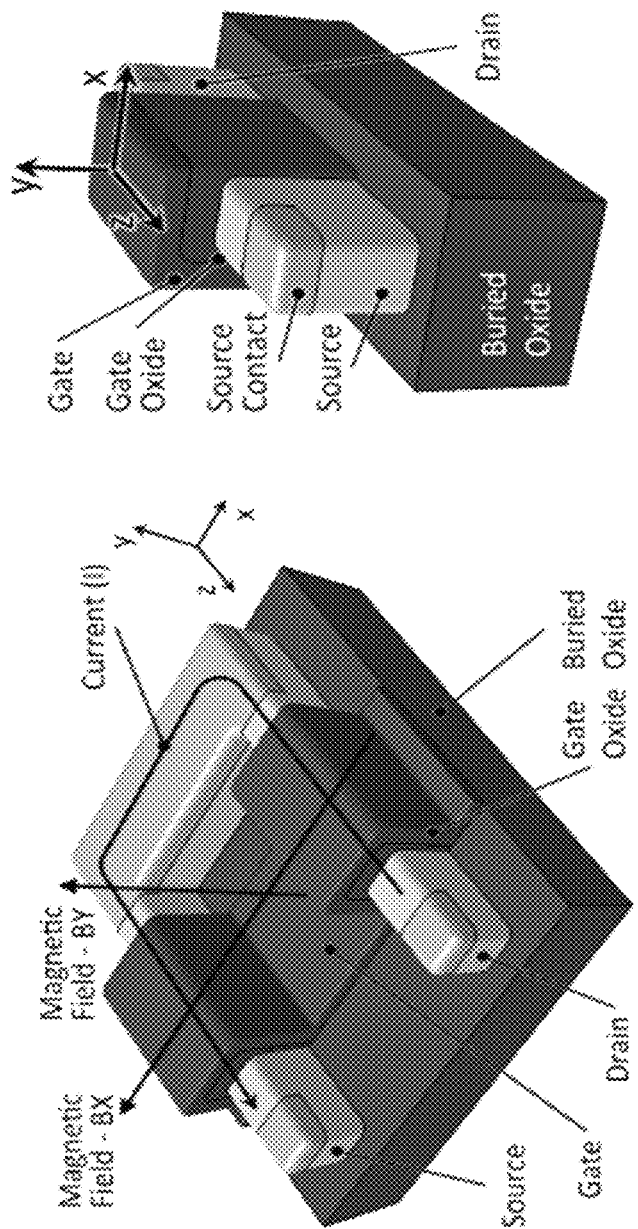
FIGS. 1A and 1B illustrate example magnetic sensing transistors.
Figure 2A:
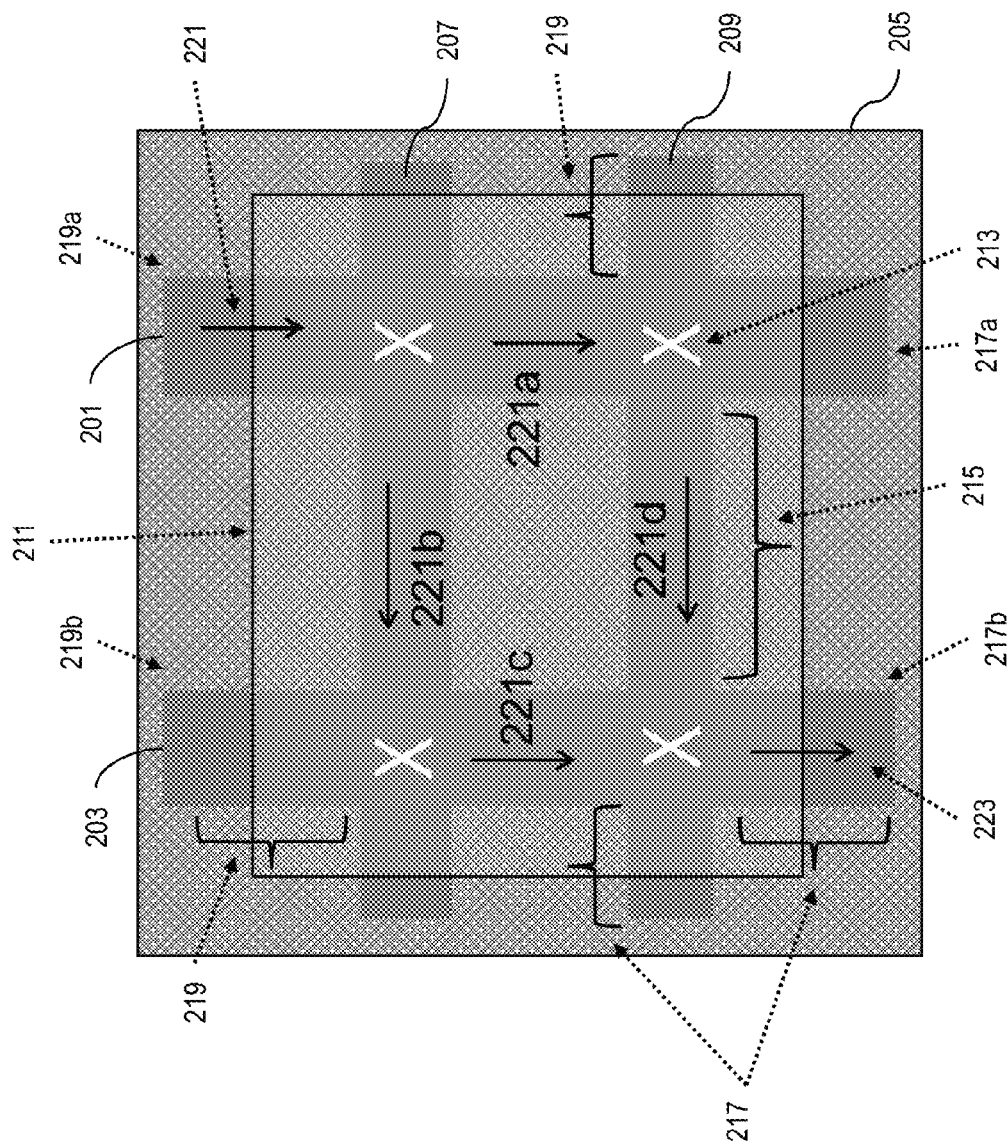

FIG. 2A illustrates first-fins 201 and 203, which are parallel to and spaced from each other, formed in a first direction on a substrate 205. Second-fins 207 and 209, which are parallel to and spaced from each other, are also formed on the substrate in a second direction perpendicular to and crossing the first-fins 201 and 203. The first and second fins may be formed by forming first-fin-spacers, parallel to and spaced from each other, on the substrate. Next, second-fin-spacers are formed, parallel to and spaced from each other, which are perpendicular to and cross the first-fin-spacers. Exposed sections of the substrate are removed. Next, the first and second fin-spacers are removed to reveal the first and second fins. Alternatively, the first and second fins may be formed by forming a hard-mask layer on the substrate. Removing sections of the hard-mask layer to form first-fin patterns and second-fin patterns that are perpendicular to and cross the first-fin patterns on the hard-mask. Then, exposed sections of the substrate are removed to form the first and second fins.

A high-k/metal gate 211 is formed over intersections 213 between each of two adjacent first-fins 201 and 203 and each of two adjacent second-fins 207 and 209 and first and second fins sections 215 connecting the intersections 213. The gate 211 may be formed by utilizing conventional FinFET fabrication processes such as forming a dummy gate, with a spacer on each side, over channel areas of the second and first-fins; forming source/drain (S/D) regions 217 and 219 at opposite ends of each second-fin 207 and 209 and each first-fin 201 and 203; depositing an ILD over the fins and dummy gate and planarizing by chemical mechanical polishing (CMP) to reveal the dummy gate; removing the dummy gate, forming a cavity; forming the high-k/metal gate 211 in the cavity; and forming contacts through the ILD over the S/D regions. The S/D regions may be epitaxial silicon germanium (eSiGe) for p-type S/D regions or epitaxial silicon (Si-epi) for n-type raised S/D regions, and each may have in-situ or implant doping. The first-fins may have different dimensions (e.g., width, thickness, etc.) compared to the second-fins. The crossed-fins structure may include additional fins and loops for a higher sensitivity, integration into scaled down IC devices, application/customer requirements, etc. The gate may be over all fins to form and control as one device, e.g., one FinFET sensor. The resulting FinFET may be n-type or p-type.

Figure 3C:
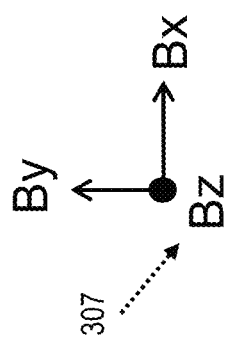

As previously noted, the FinFET structure of FIG. 2A may be utilized to detect and measure components of a magnetic field 301, shown in FIG. 3A.

The high-k/metal gate 211 may be biased for an inversion state, wherein S/D regions 217a, 217b, 219a, and 219b of the second and first-fins are in an electrical floating state. A first input current 221 (from a known current source) may be connected to a drain region 219a of a first first-fin 201, wherein the current 221 may produce currents 221a, 221b, 221c, and 221d in the first and second fins. Next, a first output current 223 is measured at a source region 217b of a second first-fin 203. The measured output current 223 is modulated by a deflection of charge-carriers by a magnetic field component perpendicular to a direction of charge-carriers' movement, (e.g. Hall-effect). Then, a first current-difference between the first input 221 and output 223 currents is measured (e.g. 221-223). The known current source is best selected as a calibration current if there is no magnetic field.

Next, as illustrated in FIG. 2B, the first input current 221 is disconnected/removed from the drain region 219a and connected/input to a drain region 219b of the second first-fin 203. A second output current 225 is measured at a source region 217a of the first first-fin 201. Then, a second current-difference between the first input 221 and second output 225 currents is measured (e.g. 221-225). The first and second current differences of the FIGS. 2A and 2B, respectively, are absorbed by the substrate (e.g. as leakage current into the substrate) due to Hall-effects of the magnetic field on the input current 221 flowing through the FinFET structure. The second output current 225 can be continuously measured as an advantage.

A first component $B_X$, 303 (shown in FIG. 3B) in a first direction parallel to the horizontal plane of the first and second fins, of the magnetic field 301 can generate Lorentz force (e.g. upward or downward) applied to currents 221a and 221c. A second component $B_Y$, 305 in a second direction parallel to the horizontal plane of the first and second fins, of the magnetic field 301 can generate Lorentz force applied to currents 221b and 221d, depending on charge carrier direction and field direction.

The first component $B_X$ is proportional to a sum of the first and second current differences of measurement. The second component $B_Y$ is proportional to a difference between the first and second current differences of measurement.

Figure 2C:
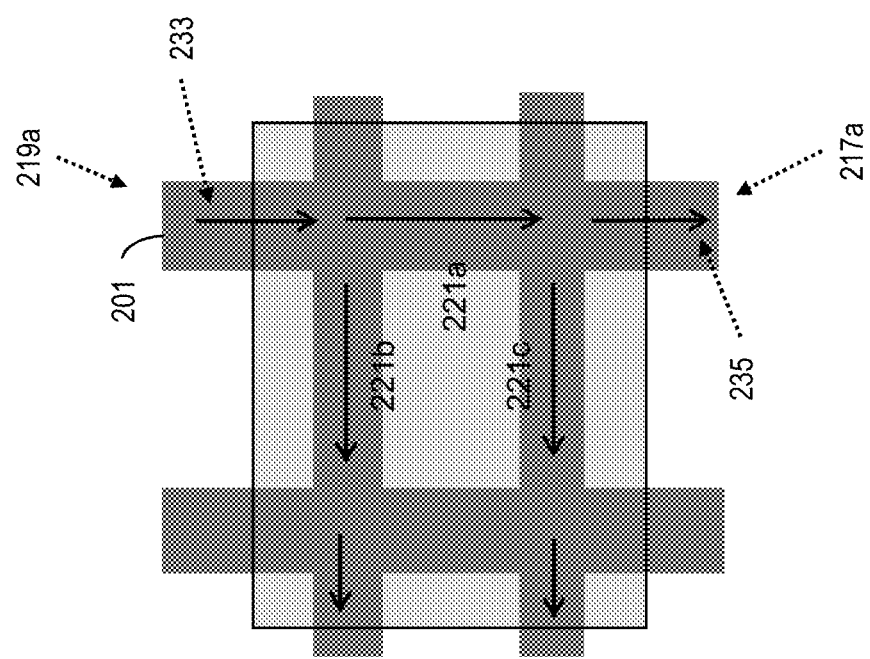

The first input current 221 is disconnected from the drain region 219b of the second first-fin 203, and as illustrated in FIG. 2C, a second input current 233 (e.g. a known current source) is connected/input at the drain region 219a of the first first-fin 201. A third output current 235 is measured at the source region 217a of the first first-fin 201. A third current-difference between the second input 233 and third output 235 is measured.

Figure 2D:
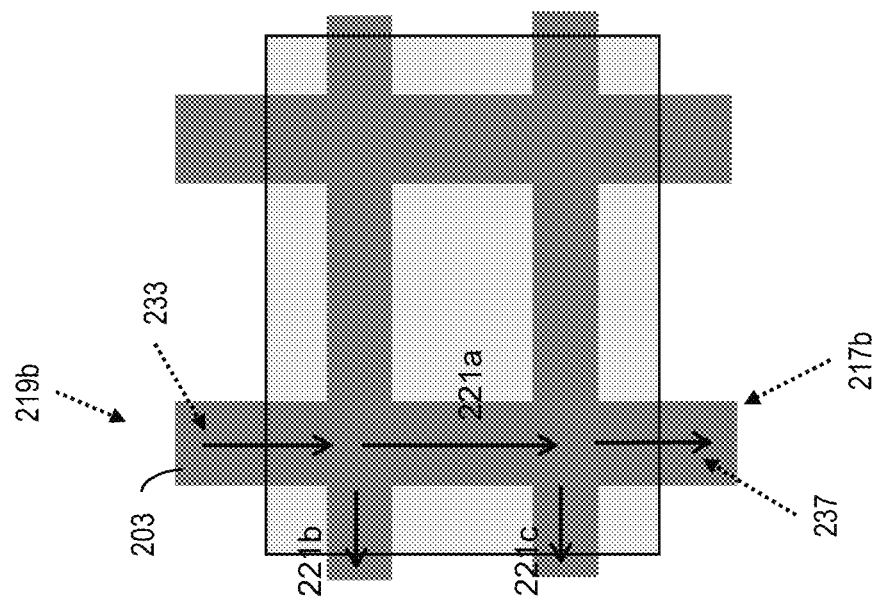

Adverting to FIG. 2D, the second input current 233 (e.g. at constant current source) is disconnected from the drain region 219a and now connected to the drain region 219b of the second first-fin 203. A fourth output current 237 is measured at the source region 217b of the second first-fin 203. A fourth current-difference between the second input 233 and fourth output 237 currents is measured. The currents 221b and 221c of the FIGS. 2C and 2D are absorbed by the substrate (e.g. as leakage current to substrate) due to Hall-effects of the magnetic field on the input current flowing through the FinFET structure. The crossed-fins structure of FIGS. 2A through 2D may be more sensitive to a magnetic field if the input current 221, in FIGS. 2A and 2B, is slightly different than the input current 233 in FIGS. 2C and 2D. The input current sources 221 and 223 may have a magnitude of 1 μA to 1 mA where the magnitude of the current sources 221 and 223 may be same or may be different (e.g. a difference of less than 20%).

A third component $B_Z$, 307 (shown in FIG. 3C), of the magnetic field 301 (e.g. perpendicular to a plane of the first and second fins) can generate Lorentz force on current 221a, i.e., to the left/right depending on charge carrier direction and field direction. A difference between the third and fourth current differences is proportional to the third component $B_Z$, 307, with a sign/direction consistent with the polarity of magnetic field 301. The components $B_X$ and $B_Y$ have no effect on this measurement.

Figure 4:
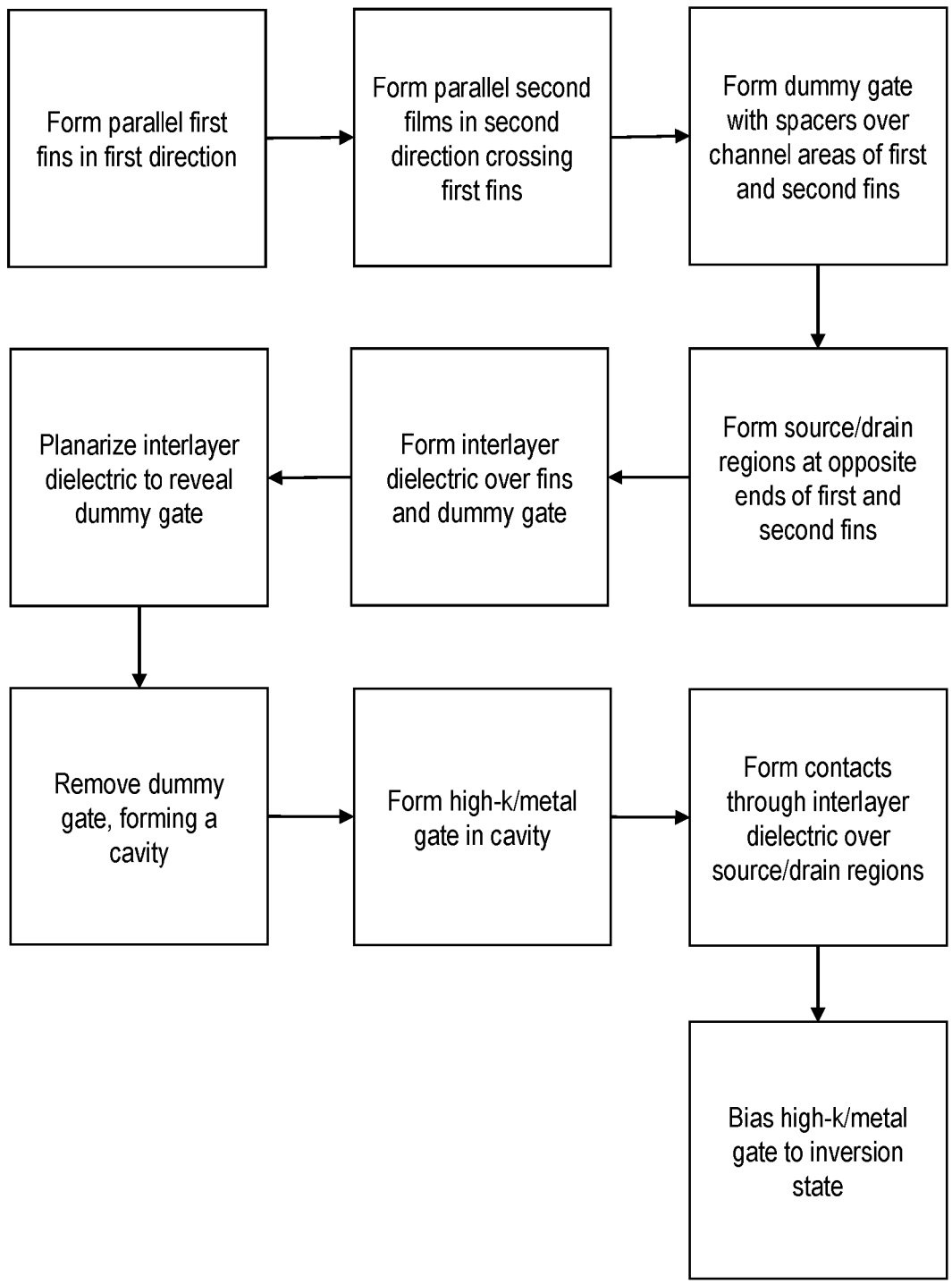
FIG. 4 illustrates a flowchart diagram describing the method of fabricating an IC device in accordance with an exemplary embodiment.

FIG. 4 is a flowchart diagram illustrative of the process, described above, for fabricating the IC device.

The embodiments of the present disclosure can achieve several technical effects including an efficient and effective crossed-fins FinFET device for sensing and measuring magnetic fields. The fabrication process of the crossed-fins FinFET device is simpler and scalable by increasing the number of fins. The device can provide better sensitivity (e.g. two times higher) than conventional FinFET or planar magnetic sensors, and the signal current is sensitive to the critical dimension (CD) and size of the fins. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming first-fins, parallel to and spaced from each other, in a first direction on a substrate;
   forming second-fins, parallel to and spaced from each other on the substrate, in a same plane as the first-fins and in a second direction perpendicular to and crossing the first-fins;
   forming a dummy gate with a spacer on each side over channel areas of the first and second fins;
   forming source/drain (S/D) regions at opposite ends of each first and second fin;
   forming an interlayer dielectric (ILD) over the fins and the dummy gate and planarizing to reveal the dummy gate;
   removing the dummy gate, forming a cavity;
   forming a high-k/metal gate in the cavity;

forming contacts through the ILD over the S/D regions; and biasing the high-k/metal gate to an inversion state, wherein the S/D regions of the second and first-fins are in an electrical floating state.

2. The method according to claim 1, comprising forming the first and second fins by:
forming a hard-mask layer on the substrate;
removing sections of the hard-mask layer, forming first-fin patterns and second-fin patterns perpendicular to and crossing the first-fin patterns on the hard-mask; and
removing exposed sections of the substrate to form the first and second fins.

3. A method, comprising:
in a semiconductor device comprising first-fins, parallel to and spaced from each other, in a first direction on a substrate, second fins parallel to and spaced from each other on the substrate, in a same plane as the first-fins and in a second direction perpendicular to and crossing the first-fins, channel areas of the first and second fins, source/drain (S/D) regions at opposite ends of each first and second fin, an interlayer dielectric (ILD) over the fins, a high-k/metal gate in a cavity, and contacts through the ILD over the S/D regions, wherein the high-k/metal gate is biased to an inversion state and wherein the S/D regions of the second and first fins are in an electrical floating state,
connecting a first input current to a drain region of a first first-fin;
measuring a first output current at a source region of a second first-fin; and
measuring a first current-difference between the first input and output currents in a presence of a magnetic field.

4. The method according to claim 3, comprising:
disconnecting the first input current;
connecting the first input current to a drain region of the second first-fin;
measuring a second output current at a source region of the first first-fin; and
measuring a second current-difference between the first input and second output currents in the presence of the magnetic field.

5. The method according to claim 4, wherein:
a sum of the first and second current differences is proportional to a first component, in a first direction in a same plane as the first and second fins, of the magnetic field.

6. The method according to claim 5, wherein:
a difference between the first and second current differences is proportional to a second component, in a second direction in the same plane of the first and second fins, of the magnetic field.

7. The method according to claim 4, comprising:
disconnecting the first input current from the drain region of the second first-fin;
connecting a second input current to the drain region of the first first-fin;
measuring a third output current at a source region of the first first-fin; and
measuring a third current-difference between the second input and third output currents in the presence of the magnetic field.

8. The method according to claim 7, comprising:
disconnecting the second input current;
connecting the second input current to a drain region of the second first-fin;
measuring a fourth output current at the source region of the second first-fin; and
measuring a fourth current-difference between the second input and fourth output currents in the presence of the magnetic field.

9. The method according to claim 8, wherein:
a difference between the third and fourth current differences is proportional to a third component of the magnetic field that is perpendicular to a plane of the first and second fins.

10. A method comprising:
forming first-fin-spacers, parallel to and spaced from each other, in a first direction on a substrate;
forming second-fin-spacers, parallel to and spaced from each other on the substrate, in a same plane as the first-fin-spacers and in a second direction perpendicular to and crossing the first-fin-spacers;
removing exposed sections of the substrate;
removing the first and second fin-spacers to reveal first and second fins;
forming a dummy gate with a spacer on each side over channel areas of the first and second fins;
forming source/drain (S/D) regions at opposite ends of each first and second fin;
forming an interlayer dielectric (ILD) over the fins and the dummy gate and planarizing to reveal the dummy gate;
removing the dummy gate, forming a cavity;
forming a high-k/metal gate in the cavity;
forming contacts through the ILD over the S/D regions; and
biasing the high-k/metal gate to an inversion state, wherein the S/D regions of the first and second fins are in an electrical floating state.

* * * * *